United States Patent
Hao et al.

(10) Patent No.: US 12,531,208 B2
(45) Date of Patent: Jan. 20, 2026

(54) LOW TEMPERATURE PLASMA ENHANCED CHEMICAL VAPOR DEPOSITION PROCESS INCLUDING PREHEATED SHOWERHEAD

(71) Applicant: LAM RESEARCH CORPORATION, Fremont, CA (US)

(72) Inventors: Boyi Hao, Tigard, OR (US); Joseph Wei, Portland, OR (US); Chengzhu Qi, Lake Oswego, OR (US); Pragati Kumar, Sherwood, OR (US); Sardar Sardari, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 532 days.

(21) Appl. No.: 17/761,951

(22) PCT Filed: Sep. 16, 2020

(86) PCT No.: PCT/US2020/050953
§ 371 (c)(1),
(2) Date: Mar. 18, 2022

(87) PCT Pub. No.: WO2021/061461
PCT Pub. Date: Apr. 1, 2021

(65) Prior Publication Data
US 2022/0336191 A1    Oct. 20, 2022

Related U.S. Application Data

(60) Provisional application No. 62/904,246, filed on Sep. 23, 2019.

(51) Int. Cl.
*H01J 37/32*    (2006.01)
*C23C 16/455*    (2006.01)
(Continued)

(52) U.S. Cl.
CPC .... *H01J 37/3244* (2013.01); *C23C 16/45565* (2013.01); *C23C 16/505* (2013.01);
(Continued)

(58) Field of Classification Search
CPC .... H05H 1/34; C23C 16/46; C23C 16/45565; C23C 16/4557; C23C 16/45574;
(Continued)

(56) References Cited

U.S. PATENT DOCUMENTS 9,018,022 B2    4/2015    Nam et al.
9,245,718 B2    1/2016    Nam et al.
(Continued)

FOREIGN PATENT DOCUMENTS

| CN | 101663417 A | 3/2010 |
| CN | 103681304 A | 3/2014 |
| KR | 100261564 B1 | 7/2000 |

OTHER PUBLICATIONS

Office Action issued in Corresponding Taiwanese Patent App. No. 109132699 mailed Apr. 16, 2024.
(Continued)

*Primary Examiner* — Edward Chin (57) ABSTRACT

A plasma enhanced chemical vapor deposition processing method is provided and includes: preheating a showerhead to a preheated state prior to and in preparation of a plasma enhanced chemical vapor deposition process of a substrate; determining at least one temperature of the showerhead while preheating the showerhead; determining based on the at least one temperature whether to continue preheating the showerhead; ceasing to preheat the showerhead in response to the at least one temperature satisfying a temperature criterion; and initiating the plasma enhanced chemical vapor deposition process while the showerhead is in the preheated state to package previously fabricated integrated circuits
(Continued)

disposed on the substrate, wherein the plasma enhanced chemical vapor deposition process includes forming one or more film protective layers over the integrated circuits.

16 Claims, 5 Drawing Sheets

(51) Int. Cl.
*C23C 16/505* (2006.01)
*C23C 16/52* (2006.01)
*H01L 21/02* (2006.01)

(52) U.S. Cl.
CPC ........ *C23C 16/52* (2013.01); *H01J 37/32183* (2013.01); *H01J 37/32935* (2013.01); *H01L 21/02274* (2013.01); *H01J 37/32091* (2013.01); *H01J 37/32568* (2013.01); *H01J 2237/24585* (2013.01); *H01J 2237/3321* (2013.01)

(58) Field of Classification Search
CPC ........ H01J 2237/2001; H01J 37/32724; H01L 21/67069; H05B 7/18
See application file for complete search history.

(56) References Cited

U.S. PATENT DOCUMENTS

| 9,396,910 | B2 | 7/2016 | Nam et al. |
| 9,458,537 | B2 | 10/2016 | Rajagopalan et al. |
| 9,476,120 | B2 | 10/2016 | Meinhold et al. |
| 2005/0241766 | A1 | 11/2005 | Dhindsa et al. |
| 2012/0045902 | A1* | 2/2012 | Fischer ............. C23C 16/45565 438/758 |
| 2013/0180963 | A1* | 7/2013 | Zhang ...................... H05B 7/18 219/121.54 |
| 2022/0172968 | A1* | 6/2022 | Lin ........................ C23C 14/54 |

OTHER PUBLICATIONS

International Search Report and Written Opinion of the ISA issued in PCT/US2020/050953, mailed Dec. 21, 2020; ISA/KR.

* cited by examiner

LOW TEMPERATURE PLASMA ENHANCED CHEMICAL VAPOR DEPOSITION PROCESS INCLUDING PREHEATED SHOWERHEAD

CROSS-REFERENCE TO RELATED APPLICATIONS

This application is a U.S. National Phase Application under 35 U.S.C. 371 of International Application No. PCT/US2020/050953, filed on Sep. 16, 2020, which claims the benefit of U.S. Provisional Application No. 62/904,246, filed on Sep. 23, 2019. The entire disclosures of the application referenced above is are incorporated herein by reference.

FIELD

The present disclosure relates to showerheads of substrate processing systems performing plasma enhanced chemical vapor deposition (PECVD).

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system, such as a PECVD processing system, typically includes a showerhead and a substrate support for supporting a substrate. During operation, the showerhead distributes reactant gas above the substrate. A radio frequency (RF) potential is provided between two electrodes (e.g., the showerhead and an RF electrode in the substrate support) to generate plasma. Energized electrons ionize or dissociate reactant gases from the plasma and create chemically reactive radicals. As these radicals react, a thin film is deposited on the substrate.

SUMMARY

A plasma enhanced chemical vapor deposition processing method is provided and includes: preheating a showerhead to a preheated state prior to and in preparation of a plasma enhanced chemical vapor deposition process of a substrate; determining at least one temperature of the showerhead while preheating the showerhead; determining based on the at least one temperature whether to continue preheating the showerhead; ceasing to preheat the showerhead in response to the at least one temperature satisfying a temperature criterion; and initiating the plasma enhanced chemical vapor deposition process while the showerhead is in the preheated state to package previously fabricated integrated circuits disposed on the substrate. The plasma enhanced chemical vapor deposition process includes forming one or more film protective layers over the integrated circuits.

In other features, the plasma enhanced chemical vapor deposition processing method further includes limiting the plasma enhanced chemical vapor deposition process to temperatures less than or equal to 200° C.

In other features, the plasma enhanced chemical vapor deposition processing method further includes limiting temperatures of the showerhead to be between 50-200° C. while preheating the showerhead prior to performing the plasma enhanced chemical vapor deposition process.

In other features, the plasma enhanced chemical vapor deposition processing method further includes evacuating a processing chamber subsequent to preheating the showerhead and prior to initiating the plasma enhanced chemical vapor deposition process. The showerhead is disposed within the processing chamber.

In other features, the preheating of the showerhead includes: supplying a reactant gas to a processing chamber; and supplying radio frequency power to at least one of a first electrode disposed in a substrate support or a second electrode disposed in the showerhead to generate plasma. The showerhead is disposed in the processing chamber. In other features, the preheating of the showerhead includes supplying electrical current to at least one heating element in the showerhead. In other features, the preheating of the showerhead includes heating a fluid supplied to the showerhead.

In other features, the plasma enhanced chemical vapor deposition processing method further includes: preheating the showerhead prior to performing a series of multiple plasma enhanced chemical vapor deposition processes; and either refraining from preheating the showerhead while and between consecutive ones of the plasma enhanced chemical vapor deposition processes or preheating the showerhead between two of the plasma enhanced chemical vapor deposition processes.

In other features, the substrate is disposed on a substrate support. The substrate support includes a first electrode. The showerhead includes a second electrode. The plasma enhanced chemical vapor deposition process includes providing radio frequency power to at least one of the first electrode and the second electrode.

In other features, the plasma enhanced chemical vapor deposition processing method further includes: ceasing preheating of the showerhead based on the at least one temperature; and evacuating the processing chamber subsequent to ceasing the preheating of the showerhead and prior to the plasma enhanced chemical vapor deposition process.

In other features, the plasma enhanced chemical vapor deposition processing method further includes: continuing preheating the showerhead in response to the at least one temperature being less than or equal to a predetermined temperature; and ceasing preheating the showerhead in response to the at least one temperature being greater than the predetermined temperature.

In other features, the plasma enhanced chemical vapor deposition processing method further includes: preheating the showerhead prior to performing a series of multiple plasma enhanced chemical vapor deposition processes; and refraining from preheating the showerhead while and between consecutive ones of the plasma enhanced chemical vapor deposition processes.

In other features, the plasma enhanced chemical vapor deposition processing method further includes: performing a series of plasma enhanced chemical vapor deposition processes; and preheating the showerhead prior to performing each of the plasma enhanced chemical vapor deposition processes and between consecutive ones of the plasma enhanced chemical vapor deposition processes.

In other features, the plasma enhanced chemical vapor deposition processing method further includes performing another plasma enhanced chemical deposition process to fabricate the integrated circuits prior to the preheating of the showerhead. The another plasma enhanced chemical deposition process includes heating the showerhead to a temperature between 150-350° C. The preheating of the showerhead the performing of the plasma enhanced chemical deposition process subsequent to the preheating of the showerhead includes limiting the temperature of the showerhead to less than or equal to 200° C.

In other features, the plasma enhanced chemical vapor deposition processing method further includes performing another plasma enhanced chemical deposition process to fabricate the integrated circuits prior to the preheating of the showerhead. The another plasma enhanced chemical deposition process includes heating the showerhead to a temperature greater than 200° C. The preheating of the showerhead the performing of the plasma enhanced chemical deposition process subsequent to the preheating of the showerhead includes limiting the temperature of the showerhead to less than or equal to 200° C.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A first PECVD process is often performed to manufacture integrated circuits (ICs). During the first PECVD process, a substrate is held on a substrate support within a processing chamber. Reactant gases are supplied via a showerhead that is disposed above the substrate. The showerhead and the substrate support include electrodes. One or more of the electrodes is supplied RF power to excite the reactant gases and form plasma to deposit, for example, film layers on the substrate. Subsequent to depositing one or more film layers, the processing chamber is evacuated.

To improve deposition uniformity across the substrate, the showerhead may be heated to a predetermined temperature (e.g., 150-350° C.) prior to and while performing the first PECVD process. This may occur for IC manufacturing processes, where high-temperature PECVD is implemented and processing chamber temperatures are greater than or equal to 400° C.

Subsequent to the manufacturing of ICs, a second PECVD process may be performed to package the ICs. The second PECVD process is performed to provide one or more protective dielectric layers over the ICs. The second PECVD process may be performed at low temperatures. As an example, packaging requirements can limit temperatures of, for example, a substrate during the second PECVD process to be less than or equal 200° C. The showerhead is not heated prior to performing the second PECVD process, but heats up during the second PECVD process. Limiting the second PECVD process to temperatures less than 200° C. prevents activation of an adhesive material between, for example, a silicon layer of a substrate and a glass layer of a substrate carrier. This prevents movement of the substrate relative to the substrate carrier during processing. The substrate carrier is used to handle the substrate during processing and is later removed from the substrate. Low deposition temperatures are also required in applications where higher chemical vapor deposition temperatures can damage fabricated devices.

During the low temperature PECVD process, deposition film layer instability (or trending) can occur in a substrate due to temperature variation of the showerhead. The temperature of the showerhead increases during the low temperature PECVD process due to generated plasma. This is especially true when multiple low temperature PECVD processes are performed in series to package ICs of respective substrates; one substrate per low temperature PECVD process. This repetitive and/or continuous exposure to plasma increases the temperature of the showerhead. The process trending includes trends in deposition film thickness and stress. For example, the deposition film thickness can trend up by 15% and the stress can trend up by 35% over a series of 25 PECVD processes performed to package ICs of respectively 25 substrates. This significant process trending hinders wide use of PECVD for low temperature applications, such as low temperature IC packaging.

The examples set forth herein include preheating a showerhead prior to performing low temperature PECVD. The preheating may be performed: prior to performing low temperature PECVD on a single substrate; prior to performing a series of low temperature PECVD processes for multiple substrates; and/or prior to each low temperature PECVD process performed in series for multiple substrates. The preheating may be performed prior to a series of low temperature PECVD processes and/or between sequentially-performed low temperature PECVD processes. By heating the showerhead before starting a low temperature PECVD process, film properties (temperature, thickness, and stress) of a substrate become highly stable.

Figure 1:
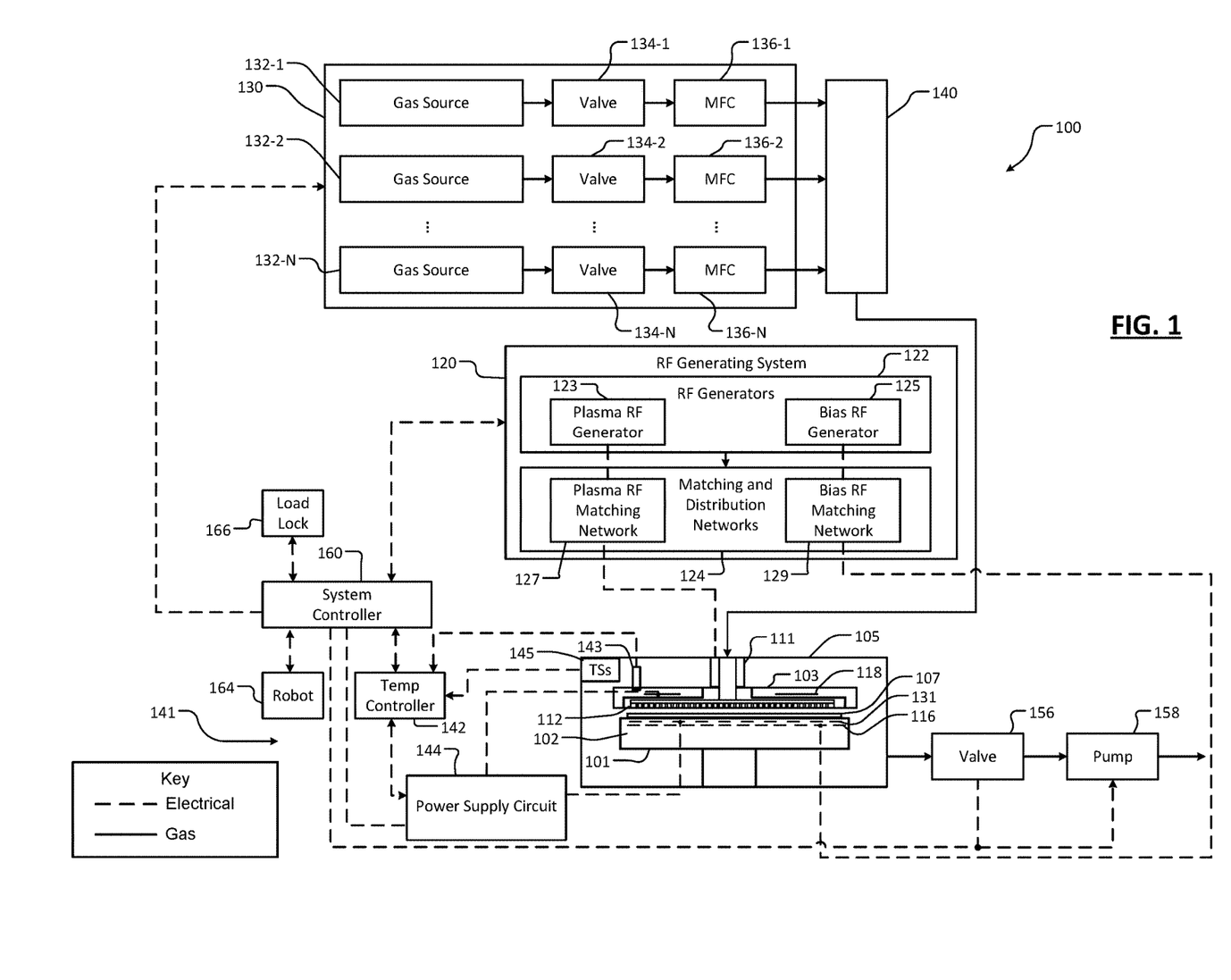
FIG. 1 is a functional block diagram of an example of a substrate processing system incorporating a showerhead and implementing a heating process in accordance with an embodiment of the present disclosure.
Figure 2:
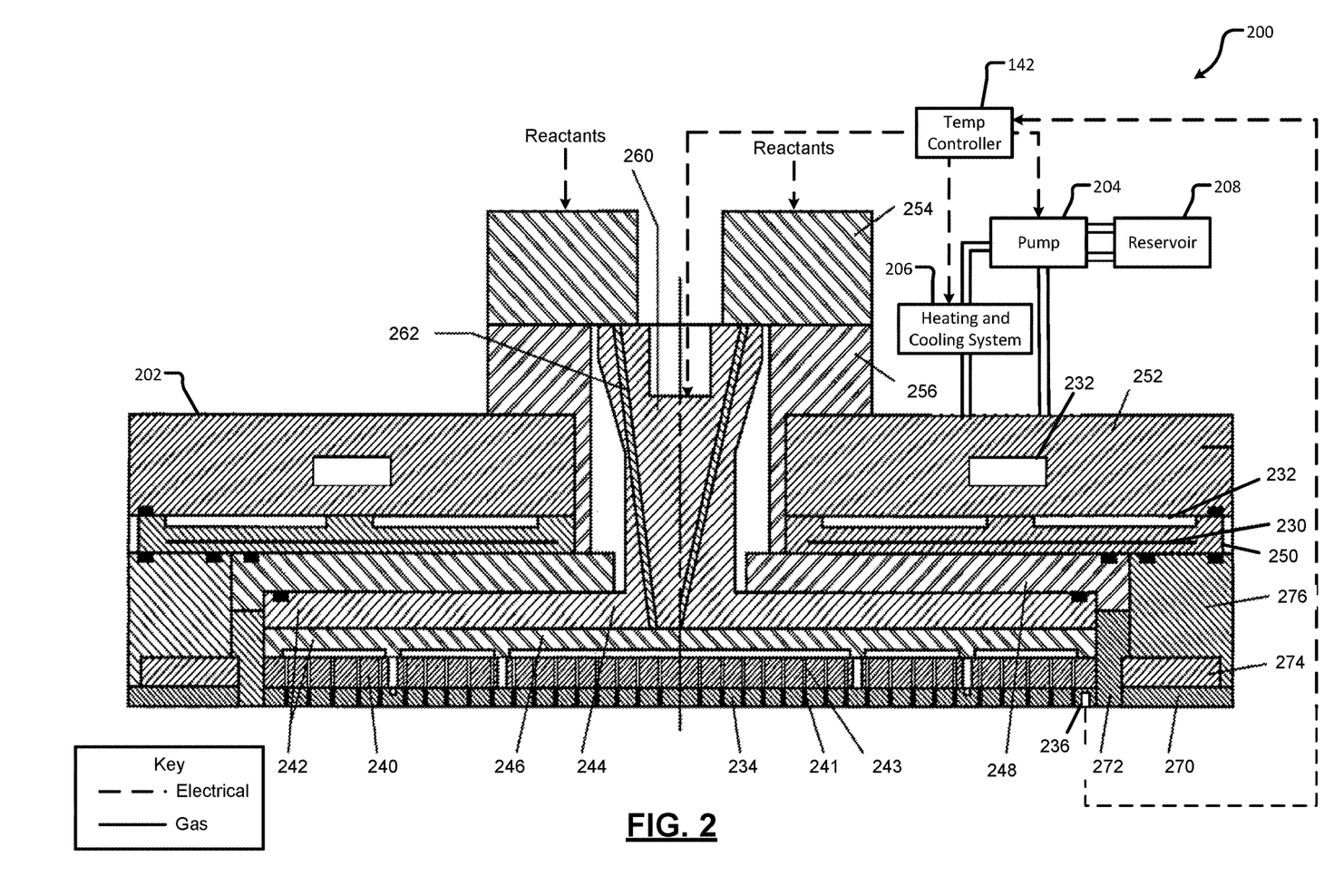
FIG. 2 is a functional block diagram of an example of a showerhead preheating system in accordance with an embodiment of the present disclosure.

FIG. 1 shows a substrate processing system 100 that may include an ESC 101 or other substrate support and a showerhead 103. Although FIG. 1 shows a capacitive coupled plasma (CCP) system, the embodiments disclosed herein are applicable to transformer coupled plasma (TCP) systems, inductively coupled plasma (ICP) systems and/or other systems and plasma sources that include a showerhead, which may be heated. The embodiments are applicable to low temperature PECVD processes and may be applicable to low temperature PEALD processes, and low temperature chemically enhanced plasma vapor deposition (CEPVD) processes. Although the ESC 101 and the showerhead 103 are shown as including a particular structure, the ESC 101 and the showerhead 103 may have other structures. For example, the ESC 101 is shown having a monolithic body 102, the ESC 101 may include multiple plates. The showerhead 103 may include multi-plate and/or a stacked layer arrangements. A couple of examples of different showerhead arrangements are shown in FIGS. 1-2.

The substrate processing system 100 includes a processing chamber 105. The ESC 101 and the showerhead 103 are enclosed within the processing chamber 105. The processing chamber 105 may contain RF plasma. During operation, a substrate 107 is arranged on and electrostatically clamped to the ESC 101. The showerhead 103 introduces and distributes gases. The showerhead 103 may include a stem portion 111 including one end connected to a top surface of the processing chamber 105. The showerhead 103 is generally cylindrical and extends radially outward from an opposite end of the stem portion 111 at a location that is spaced from the top surface of the processing chamber 105. A substrate-facing surface of the showerhead 103 includes holes through which process or purge gas flows.

An RF generating system 120 generates and outputs RF voltages to one or more upper electrodes 112 in the showerhead and/or one or more lower electrodes 116 in the ESC 101. The upper electrodes 112 or the lower electrodes 116 may be DC grounded, AC grounded or at a floating potential. For example only, the RF generating system 120 may include one or more RF generators 122 (e.g., a capacitive coupled plasma RF power generator, a bias RF power generator, and/or other RF power generator) that generate RF voltages, which are fed by one or more matching and distribution networks 124 to the upper electrodes 112 and/or the lower electrodes 116. As an example, a plasma RF generator 123, a bias RF generator 125, a plasma RF matching network 127 and a bias RF matching network 129 are shown. The plasma RF generator 123 may be a high-power RF generator producing, for example 100 watts (W) to 10 kilo-watts (kW) of power. The bias RF matching network 129 supplies power to RF electrodes, such as RF electrodes 116.

The showerhead 103 may include one or more heating elements 118, which may be used to heat the showerhead 103 prior to performing a low temperature PECVD process. The heating elements 118 may be in the form of electrodes receiving electrical current as shown, or may be in some other form, such as one or more fluid channels receiving a heated fluid. The heated fluid may be received from, for example, a pump that pumps the heated fluid from a reservoir or heater to the showerhead. An example of a fluid channel, pump, a reservoir and a heater are shown in FIG. 2. The heating elements 118 may receive current from a power supply circuit 144.

A gas delivery system 130 includes one or more gas sources 132-1, 132-2, . . . , and 132-N (collectively gas sources 132), where N is an integer greater than zero. The gas sources 132 supply one or more precursors and gas mixtures thereof. The gas sources 132 may also supply deposition gas, carrier gas and/or purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 105. For example only, the output of the manifold 140 is fed to the showerhead 103.

The substrate processing system 100 further includes a showerhead preheating system 141 that includes a temperature controller 142, which may be connected to the heating elements 118. The temperature controller 142 controls the power supply circuit 144, which supplies power to the heating elements 118. The voltage and current supplied to the heating elements 118 may be based on detected temperatures of the showerhead 103 such as that detected by the temperature probe 143.

Although shown separately from a system controller 160, the temperature controller 142 may be implemented as part of the system controller 160. The showerhead 103 may include multiple temperature controlled zones, where each of the zones includes temperature sensors and heating elements (e.g., the heating elements 118). One example temperature sensor is the temperature probe 143. The temperature sensors may include temperature probes, resistive temperature devices, thermocouples, digital temperature sensors, etc. The temperature controller 142 may monitor temperatures as indicated by the temperature sensors and adjust current, voltage and/or power to the heating elements 118 to adjust the temperatures to target temperatures. The power supply circuit 144 may also provide power, including a high voltage, to electrodes 131 to electrostatically clamp the substrate 107 to the ESC 101. The power supply circuit 144 may be controlled by the temperature controller 142 and/or the system controller 160.

The temperature controller 142 may control operation and thus temperatures of heating elements 118 and, as a result, temperatures of the showerhead. The temperature controller 142 controls current supplied to the heating elements 118 based on detected parameters from the temperature sensors and/or parameters from other sensors, such as temperature sensors 145 within the processing chamber 105. The temperature sensors 145 may include resistive temperature devices, thermocouples, digital temperature sensors, and/or other suitable temperature sensors.

A valve 156 and the pump 158 may be used to evacuate reactants from the processing chamber 105. The system controller 160 may control components of the substrate processing system 100 including controlling supplied RF power levels, pressures and flow rates of supplied gases, RF matching, etc. The system controller 160 controls states of the valve 156 and the pump 158. A robot 164 may be used to deliver substrates onto, and remove substrates from, the ESC 101. For example, the robot 164 may transfer substrates between the ESC 101 and a load lock 166. The robot 164 may be controlled by the system controller 160. The system controller 160 may control operation of the load lock 166.

The valves, gas pumps, power sources, RF generators, etc. referred to herein may be referred to as actuators. The heating elements 118 and RF generator 123 may be referred to herein as temperature adjusting elements.

FIG. 2 shows a showerhead preheating system 200 that may replace the showerhead preheating system 141 of FIG. 1. The showerhead preheating system 200 may include the temperature controller 142, a showerhead 202, a pump 204, a heating and cooling system 206 and a reservoir 208. In the example shown, the showerhead 202 includes multiple heating elements. As shown, the heating elements include a heating electrode 230 and multiple fluid channels 232. The heating electrode 230 receives electrical current as described above. The fluid channels 232 may receive a fluid (gas or liquid) from the heating and cooling system 206 via a pump 204. The pump 204 may pump the fluid from a reservoir 208 to the heating and cooling system 206. The fluid is then circulated through the fluid channels 232. The fluid may be heated or cooled depending on the mode of operation via heating and cooling devices of the heating and cooling system 206. The heating and cooling system 206 may include a heater, a heat exchanger, a chiller, etc. As an example, the fluid may be heated during a preheat mode and may be cooled during a deposition mode. The fluid may or may not be circulated during at least a portion of each of the preheat and deposition modes. The showerhead 202 may also include one or more RF electrodes (a single RF electrode 234 is shown) to receive an RF signal for plasma generation.

The temperature controller 142 may pump fluid through the fluid channels 232 by controlling the pump 204 and temperature of the fluid via the heating and cooling system 206. The power supplied to the heating and cooling system 206 and the flow rate and/or pressure of the fluid may be set by the temperature controller 142 based on temperatures of the showerhead 202. A single temperature probe 236, which may indicate a temperature of the showerhead 202 and/or the RF electrode 234.

As shown, the showerhead 202 includes the RF electrode 234, which may be a porous plate through which reactants are dispensed onto a substrate. The RF electrode 234 may be attached to a backing member 240, which is also porous, and to gas distribution members 242. Holes 241, 243 in the RF electrode 234 and the backing member 240 are shown and are in alignment with each other. The distribution members 242 include a first plate 244 and a second plate 246 having holes for gas to pass from a backside of the showerhead 202 to a plenum between the plate 246 and the backing member 240. An insulating plate 248 is disposed between the first plate 244 and a heating member 250, which includes the heating electrode 230 and one or more of the fluid channels 232. A top plate 252 is disposed on the heater 250 and may include one or more of the fluid channels 232. A hub including insulating members 254, 256 are disposed on the top plate 252. The first plate 244 is attached to an upward extending shaft 260, which extends within the insulating member 256 and contacts the insulating member 254. The insulating member 256 is partially disposed within the top plate 252 and the heater 250. The upwarding extending shaft 260 includes members 262 for passage of reactants to the plenum. RF power is provided to the upward extending shaft 260, which then transfers the RF power to the plate 246, the backing member 240 and the RF electrode 234. A ring-shaped electrode 270 that is connected to a ground (or is at a reference ground potential) surrounds the RF electrode 234 and is separated from the RF electrode by a ring-shaped insulating member 272. A backing ring 274 is disposed on the ring-shaped electrode 270. A ring-shaped grounding ring 276 is disposed between the heater 250 and the backing ring 274 and contacts the ring-shaped electrode 270.

Figure 3:
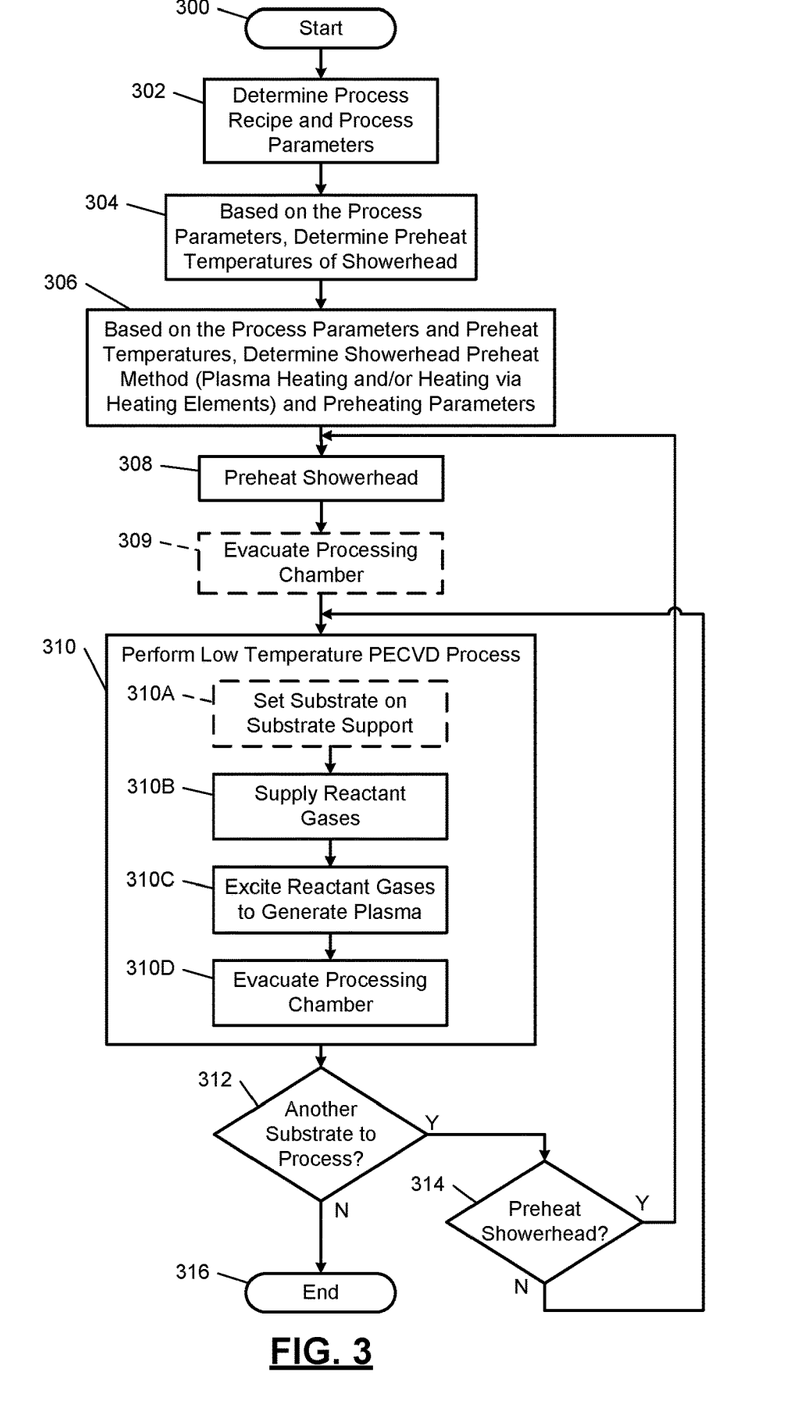
FIG. 3 illustrates an example low temperature PECVD method including showerhead preheating in accordance with an embodiment of the present disclosure.
Figure 4:
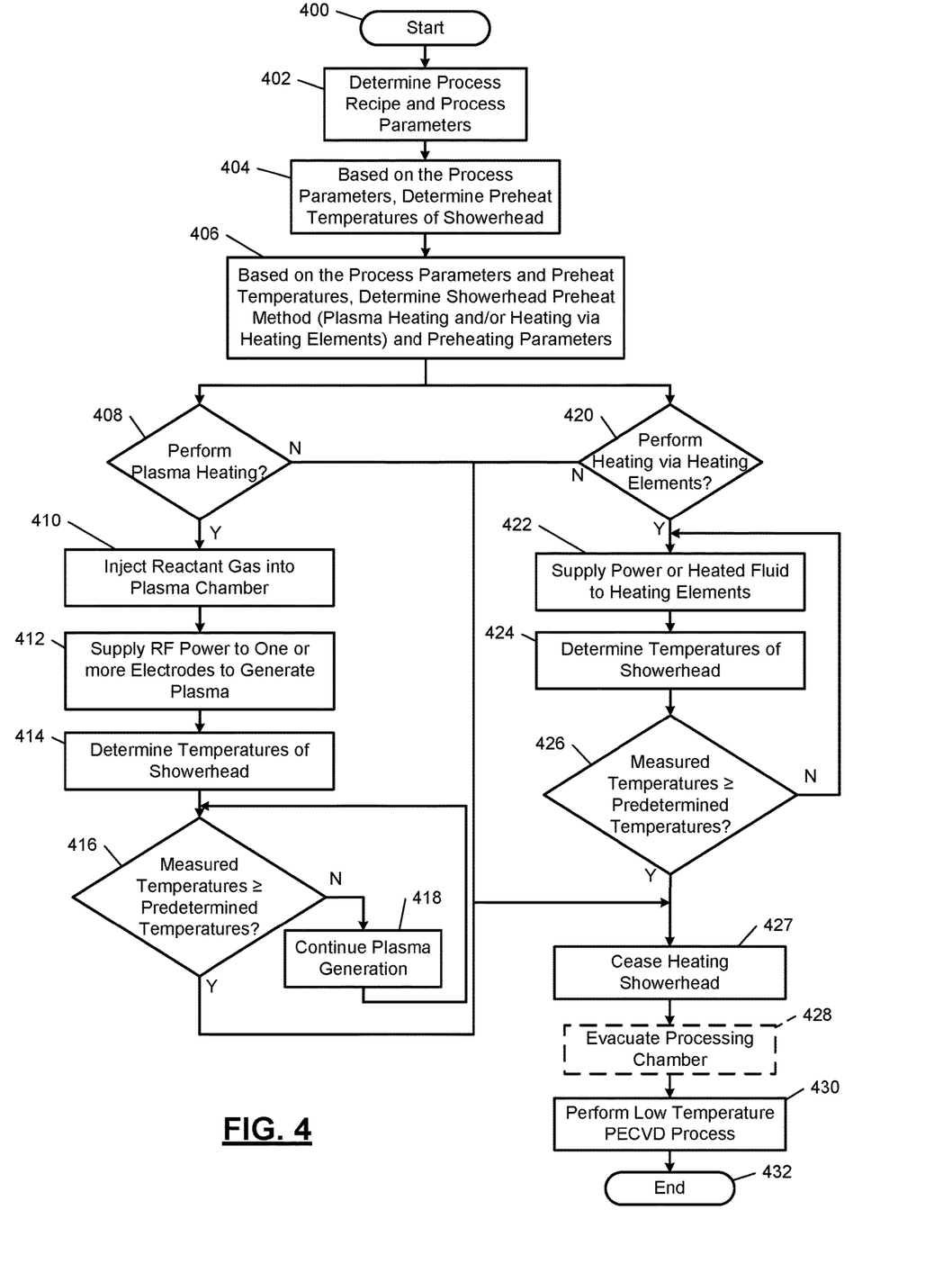
FIG. 4 illustrates an example showerhead preheating method in accordance with an embodiment of the present disclosure.

The systems disclosed herein may be operated using numerous methods, example methods are illustrated in FIGS. 3-4. In FIG. 3, a low temperature PECVD method including a showerhead preheating method is shown. The low temperature PECVD process may be performed subsequent to manufacturing ICs and to form a protective housing and/or one or more protective layers over the ICs. Although the following methods of FIGS. 3-4 are shown as separate methods, the methods and/or corresponding operations may be combined and performed as a single method. Although the following operations are primarily described with respect to the implementations of FIGS. 1-2, the operations may be easily modified to apply to other implementations of the present disclosure. The operations may be iteratively performed.

The method may begin at 300. This method may be performed subsequent to a temperature of a showerhead having cooled to a temperature less than 200° C. and in at least some instances to an ambient (or room) temperature. At 302, temperature controller 142 may determine a recipe and corresponding process parameters for a low temperature PECVD process to be performed. In one embodiment, a temperature within the processing chamber during the PECVD process is less than or equal to 200° C. In another embodiment the temperature within the processing chamber during the PECVD process is between 180-200° C. This may include determining reactants, compositions, pressures, flow rates, timing of operations, order of operations performed, etc.

At 304 and based on the process parameters, the temperature controller 142 determines preheat temperatures of a corresponding showerhead (e.g., one of the showerheads 103, 202). As an example, the temperature controller 142 may look-up the temperatures using a table relating the process parameters to showerhead temperatures. The temperatures may be temperatures within and/or across one or more zones of the showerhead.

At 306 and based on the process parameters and the preheat temperatures, the temperature controller 142 determines (i) a showerhead preheat method to perform, and (ii) preheating parameters. As a few examples, the showerhead may be heated using (i) electrodes that receive electrical current, (ii) heated fluid channels, (iii) a combination of electrodes and heated fluid channels, and/or (iv) other showerhead heating methods. The showerhead may also or alternatively be heated via plasma generation, as further described below. The preheating parameters may include: voltages and/or current levels and timing for power supplied to heating electrodes; fluid pressures, fluid flow rates, fluid temperatures, flow timing, heater voltages and/or current levels for fluid supplied to heating elements; and/or other preheating parameters (or settings).

At 308, the showerhead is preheated based on the preheating temperatures and parameters. Example preheating operations 408, 410, 412, 414, 416, 418, 420, 422, 424, 426, 427 are shown and described below with respect to FIG. 4. At 309, the processing chamber may be evacuated depending on the preheating performed. This may be determined by the temperature controller 142. For example, if plasma is generated to preheat the showerhead, then the processing chamber is evacuated. If preheating is performed using preheating elements, then the processing chamber may not be evacuated. The evacuation may include providing a vacuum pressure within the processing chamber to flush out the processing chamber. The vacuum pressure may be provided by activating the pump 158 and opening the valve 156. The evacuation may include providing an argon gas and/or other gas to the processing chamber to purge the processing chamber.

Figure 5:
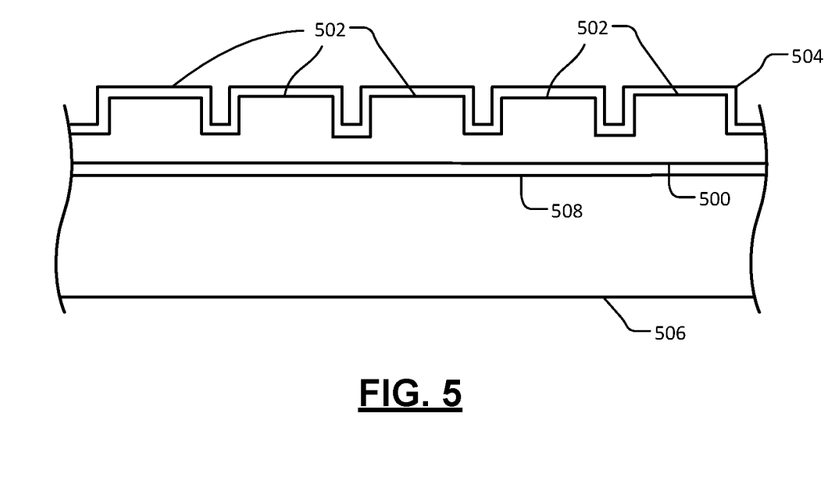
FIG. 5 is a cross-sectional view of an example of a substrate including integrate circuits and a protective layer adhered to a substrate carrier.

At 310 and subsequent to preheating the showerhead, the temperature controller 142 performs the low temperature PECVD process. This may include limiting temperatures of the showerhead to less than or equal to a predetermined temperature (e.g., 200° C.). This may include the heating and cooling system 206 cooling the showerhead to limit the temperature of the showerhead. At 310A, a substrate is set on the substrate support (or ESC) 101 the substrate may be adhered to a substrate carrier via an adhesive layer. Operation 310A may be performed prior to during and/or subsequent to preheating the showerhead at 308. The substrate may include multiple ICs. At 310B, the system controller 160 supplies reactant gases to the processing chamber. At 310C, the system controller 160 excites the reactant gases to generate plasma and deposit a film layer. The film layer may encapsulate at least a portion of each of the ICs. This includes supplying RF power to the showerhead and/or the ESC 101. The film layer may be, for example, 100-5000 nanometers (nm) thick. In one embodiment, the film layer is 0.5-1.0 millimeters (mm) thick. The thickness of the film layer is suitable for IC protection and/or isolation. In one embodiment, the thickness of the film layer is appropriate for an encapsulation of the ICs. An example substrate including ICs and a protective layer adhered to a substrate carrier is shown in FIG. 5. At 310D, the processing chamber is evacuated. This may include supplying argon gas and/or other suitable gas to the processing chamber and providing a vacuum pressure within the processing chamber to flush out the processing chamber. The film layer is a dielectric layer and may be formed of epoxy, resin, polymer, plastic, ceramic, and/or other suitable materials for forming a protective layer.

At 312, the temperature controller 142 determines whether another substrate is to be processed. If another substrate is to be processed in the processing chamber, operation 314 may be performed, otherwise the method may end at 316. At 314, the temperature controller 142 determines whether to preheat the showerhead. If the showerhead is to be again preheated, operation 308 may be performed, otherwise operation 310 may be performed. Performance of operation 308 may be based on the temperature of the showerhead as detected by one or more temperature sensors (e.g., one of the temperature probes 143, 236 and/or an amount of time since a last PECVD process.

FIG. 4 shows a showerhead preheating method. The method may begin at 400. At 402, temperature controller 142 may determine a recipe and corresponding process parameters for a low temperature PECVD process to be performed. In one embodiment, a temperature within the processing chamber during the PECVD process is less than or equal to 200° C. In another embodiment the temperature within the processing chamber during the PECVD process is 180-200° C. This may include determining reactants, compositions, pressures, flow rates, timing of operations, order of operations performed, etc.

At 404 and based on the process parameters, the temperature controller 142 determines preheat temperatures of a corresponding showerhead (e.g., one of the showerheads 103, 202). As an example, the temperature controller 142 may look-up the temperatures using a table relating the process parameters to showerhead temperatures. The temperatures may be temperatures within and/or across one or more zones of the showerhead.

At 406 and based on the process parameters and the preheat temperatures, the temperature controller 142 determines (i) a showerhead preheat method to perform and (ii) preheating parameters. As a few examples, the showerhead may be heated using (i) electrodes that receive electrical current, (ii) heated fluid channels, (iii) a combination of electrodes and heated fluid channels, and/or (iv) other showerhead heating methods. The showerhead may also or alternatively be heated via plasma generation, as further described below. The preheating parameters may include: voltages and/or current levels and timing for power supplied to heating electrodes; fluid pressures, fluid flow rates, fluid temperatures, flow timing, heater voltages and/or current levels for fluid supplied to heating elements; and/or other preheating parameters (or settings). Operations 408 and 420 may be performed subsequent to performing operation 406. Operations 408, 410, 412, 414, 416, 418 may be performed while performing operations 420, 422, 424, 426.

At 408, the temperature controller 142 may determine whether to perform plasma heating of the showerhead. Plasma heating refers to the supplying of reactant gas to the processing chamber and supplying RF power to generate plasma within the processing chamber to heat up the showerhead. The temperature controller 142 may proceed to operation 410 if plasma heating of the showerhead is to be performed, otherwise operation 428 may be performed subsequent to completing operations 420, 422, 424, and/or 426.

At 410, the temperature controller 142 injects a reactant gas (e.g., nitrous oxide (N₂O)) into the processing chamber. As an example, the reactant gas may be supplied at a flow rate of 1000-100,000 standard cubic centimeters per minute (sccms) and at a pressure of 1-10 Torr. At 412, the temperature controller 142 ignites plasma by supplying RF power to a first one or more RF electrodes in the showerhead or in the substrate support while a second one or more electrodes in the other one of the showerhead and the substrate support is connected to a reference ground. As an example, the RF power supplied to the first one or more electrodes may be 100-10,000 watts (W) and at a frequency of 5000 Hertz (Hz) to 100 mega-Hertz (MHz). In another embodiment, RF power is supplied at a first potential to one or more electrodes in the showerhead and at a second potential to one or more electrodes in the substrate support. The ignited plasma heats up the showerhead.

At 414, the temperature controller 142 determines temperatures of the showerhead via the one or more temperature sensors as described above. At 416, the temperature controller 142 determines whether the measured temperatures are greater than or equal to predetermined temperatures (e.g., a temperature between 50-200° C.), such as temperatures determined at 406. In one embodiment, the predetermined temperature is between 150-200° C. In another embodiment, the temperature is between 50-150° C. In another embodiment, the predetermined temperature is less than 150° C. If no, operation 418 may be performed, otherwise operation 428 may be performed. This may include determining (i) one or more average showerhead temperatures at a respective one or more points of the showerhead, and/or (ii) an average showerhead temperature based on temperatures at multiple points of the showerhead. The averages may be compared to predetermined average temperatures. If the predetermined average temperatures are exceeded, then operation 427 may be performed subsequent to completing operations 420, 422, 424, and/or 426. The showerhead temperature(s) may be limited to a temperature between 50-200° C.

At 418, the temperature controller 142 continues plasma generation. This may include continuing to supply the reactant gas supplied at 410 and/or RF power as supplied at 412.

At 420, the temperature controller 142 determines whether to heat the showerhead via heating elements disposed in the showerhead. Operation 422 is performed if heating elements are to be used, otherwise operation 428 may be performed subsequent to completing operations 408, 410, 412, 414, 416, and/or 418.

At 422, the temperature controller 142 supplies power and/or heated fluid to the heating elements as described above. This is done to heat up the heating elements and as a result the showerhead.

At 424, the temperature controller 142 determines temperatures of the showerhead via the one or more temperature sensors as described above. At 426, the temperature controller 142 determines whether the measured temperatures are greater than or equal to predetermined temperatures (e.g., a temperature between 50-200° C.), such as temperatures determined at 406. In one embodiment, the predetermined temperature is between 150-200° C. In another embodiment, the temperature is between 50-150° C. In another embodiment, the predetermined temperature is less than 150° C. If no, operation 422 may be performed, otherwise operation 428 may be performed. This may include determining (i) one or more average showerhead temperatures at a respective one or more points of the showerhead, and/or (ii) an average showerhead temperature based on temperatures at multiple points of the showerhead, and comparing these averages to predetermined average temperatures. If the predetermined average temperatures are exceeded, then operation 427 may be performed subsequent to completing operations 408, 410, 412, 414, 416, and/or 418. The showerhead temperature(s) may be limited to a temperature between 50-200° C.

At 427, the temperature controller 142 ceases heating the showerhead. At 428, the processing chamber may be evacuated depending on the preheating performed. This may be determined by the temperature controller 142. For example, if plasma is generated to preheat the showerhead, then the processing chamber is evacuated. If preheating is performed using preheating elements, then the processing chamber may not be evacuated. The evacuation may include providing a vacuum pressure within the processing chamber to flush out the processing chamber. The evacuation may include providing an argon gas and/or other gas to the processing chamber to purge the processing chamber. The vacuum pressure may be provided by activating the pump 158 and opening the valve 156.

At 430, a low temperature PECVD process is performed. As an example, the low temperature PECVD process 310 of FIG. 3 may be performed. The method may end at 432 subsequent to performing operation 430.

The above-described operations of FIGS. 3-4 are meant to be illustrative examples. The operations may be performed sequentially, synchronously, simultaneously, continuously, during overlapping time periods or in a different order depending upon the application. Also, any of the operations may not be performed or skipped depending on the implementation and/or sequence of events.

As an example, the above-described methods can reduce film deposition thickness trending over, for example, 25 substrates, from 15% to 5% and stress trending over the same 25 substrates from 35% to 5%. The examples improve process stability including stabilizing film deposition thicknesses and stress for low temperature PECVD processes by heating showerheads prior to performing the PECVD processes.

FIG. 5 shows an example of a substrate 500 including ICs 502 and a protective layer 504. The substrate 500 is adhered to a substrate carrier 506 via an adhesive layer 508, which may include an adhesive material that secures the substrate 500 to the substrate carrier 506 for processing and yet allows subsequent separation of the substrate 500 from the substrate carrier 506. Each of the substrate 500, the ICs 502 and the protective layer 504 may include any number of layers.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing.

The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a deposition chamber or module, a clean chamber or module, a physical vapor deposition (PVD) chamber or module, a chemical vapor deposition (CVD) chamber or module, an atomic layer deposition (ALD) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A plasma enhanced chemical vapor deposition processing method for packaging previously fabricated integrated circuits, the method comprising:
    preheating a showerhead to a preheated state prior to and in preparation of a plasma enhanced chemical vapor deposition process of a substrate;
    determining at least one temperature of the showerhead while preheating the showerhead;
    determining based on the at least one temperature whether to continue preheating the showerhead;
    ceasing to preheat the showerhead in response to the at least one temperature satisfying a temperature criterion; and
    initiating the plasma enhanced chemical vapor deposition process while the showerhead is in the preheated state to package the previously fabricated integrated circuits disposed on the substrate, wherein the plasma enhanced chemical vapor deposition process includes forming one or more film protective layers over the previously fabricated integrated circuits to package the previously fabricated integrated circuits, and
    wherein the preheating of the showerhead is implemented via plasma heating or one or more heating elements in the showerhead, and wherein the one or more heating elements are electrodes receiving electrical current.

2. The plasma enhanced chemical vapor deposition processing method of claim 1, further comprising limiting the plasma enhanced chemical vapor deposition process to temperatures less than or equal to 200° C.

3. The plasma enhanced chemical vapor deposition processing method of claim 1, further comprising limiting temperatures of the showerhead to be between 50-200° C. while preheating the showerhead prior to performing the plasma enhanced chemical vapor deposition process.

4. The plasma enhanced chemical vapor deposition processing method of claim 1 further comprising evacuating a processing chamber subsequent to preheating the showerhead and prior to initiating the plasma enhanced chemical vapor deposition process,
    wherein the showerhead is disposed within the processing chamber.

5. The plasma enhanced chemical vapor deposition processing method of claim 1, wherein the preheating of the showerhead includes:
    supplying a reactant gas to a processing chamber; and
    supplying radio frequency power to at least one of a first electrode disposed in a substrate support or a second electrode disposed in the showerhead to generate plasma, wherein the showerhead is disposed in the processing chamber, and wherein the plasma is generated to preheat the showerhead to satisfy the temperature criterion.

6. The plasma enhanced chemical vapor deposition processing method of claim 1, wherein the preheating of the showerhead includes supplying electrical current to the one or more heating elements in the showerhead to preheat the showerhead and satisfy the temperature criterion.

7. The plasma enhanced chemical vapor deposition processing method of claim 1, wherein the preheating of the showerhead includes heating a fluid supplied to the showerhead.

8. The plasma enhanced chemical vapor deposition processing method of claim 1, further comprising:
    preheating the showerhead prior to performing a series of multiple plasma enhanced chemical vapor deposition processes; and
    either
        refraining from preheating the showerhead while and between consecutive ones of the plasma enhanced chemical vapor deposition processes, or
        preheating the showerhead between two of the plasma enhanced chemical vapor deposition processes.

9. The plasma enhanced chemical vapor deposition processing method of claim 1, wherein:
    the substrate is disposed on a substrate support;
    the substrate support comprises a first electrode;
    the showerhead comprises a second electrode; and
    the plasma enhanced chemical vapor deposition process includes providing radio frequency power to at least one of the first electrode and the second electrode.

10. The plasma enhanced chemical vapor deposition processing method of claim 1, further comprising:
    ceasing preheating of the showerhead based on the at least one temperature, wherein the showerhead is disposed in a processing chamber; and evacuating the processing chamber subsequent to ceasing the preheating of the showerhead and prior to the plasma enhanced chemical vapor deposition process.

11. The plasma enhanced chemical vapor deposition processing method of claim 1, further comprising:
   continuing preheating the showerhead in response to the at least one temperature being less than or equal to a predetermined temperature; and
   ceasing preheating the showerhead in response to the at least one temperature being greater than the predetermined temperature.

12. The plasma enhanced chemical vapor deposition processing method of claim 1, further comprising:
   preheating the showerhead prior to performing a series of multiple plasma enhanced chemical vapor deposition processes; and
   refraining from preheating the showerhead while and between consecutive ones of the plasma enhanced chemical vapor deposition processes.

13. The plasma enhanced chemical vapor deposition processing method of claim 1, further comprising:
   performing a series of plasma enhanced chemical vapor deposition processes; and
   preheating the showerhead prior to performing each of the plasma enhanced chemical vapor deposition processes and between consecutive ones of the plasma enhanced chemical vapor deposition processes.

14. The plasma enhanced chemical vapor deposition processing method of claim 1, further comprising performing another plasma enhanced chemical deposition process to fabricate integrated circuits prior to the preheating of the showerhead, wherein:
   the another plasma enhanced chemical deposition process includes heating the showerhead to a temperature between 150-350° C. to form one or more layers of the integrated circuits;
   the preheating of the showerhead for performing of the plasma enhanced chemical deposition process to package the integrated circuits disposed on the substrate is performed subsequent to the another plasma enhanced chemical deposition process and includes limiting the temperature of the showerhead to less than or equal to 200° C.; and
   the fabricating of the integrated circuits by performing the another plasma enhanced chemical deposition process provides the previously fabricated integrated circuits upon which the plasma enhanced chemical deposition process recited in claim 1 is performed.

15. The plasma enhanced chemical vapor deposition processing method of claim 1, further comprising performing another plasma enhanced chemical deposition process to fabricate integrated circuits prior to the preheating of the showerhead, wherein:
   the another plasma enhanced chemical deposition process includes heating the showerhead to a temperature greater than 200° C. to form one or more layers of the integrated circuits;
   the preheating of the showerhead for performing the plasma enhanced chemical deposition process to package the integrated circuits disposed on the substrate is performed subsequent to the another plasma enhanced chemical deposition process and includes limiting the temperature of the showerhead to less than or equal to 200° C.; and
   the fabricating of the integrated circuits by performing the another plasma enhanced chemical deposition process provides the previously fabricated integrated circuits upon which the plasma enhanced chemical deposition process recited in claim 1 is performed.

16. The plasma enhanced chemical vapor deposition processing method of claim 1, further comprising, via a temperature controller, monitoring temperatures of the showerhead, and based on the temperatures, set a flow rate and a pressure of fluid supplied to channels in the showerhead to preheat the showerhead.

* * * * *